(12) United States Patent
Chang et al.

(10) Patent No.: US 7,457,092 B2
(45) Date of Patent: Nov. 25, 2008

(54) CURRENT LIMITED BILATERAL MOSFET SWITCH WITH REDUCED SWITCH RESISTANCE AND LOWER MANUFACTURING COST

(75) Inventors: Allen Chang, Fremont, CA (US); Zhinan Wei, San Jose, CA (US)

(73) Assignee: Alpha & Omega Semiconductor, LLD. (BM)

( * ) Notice: Subject to any disclaimer, the term of this patent is extended or adjusted under 35 U.S.C. 154(b) by 274 days.

(21) Appl. No.: 11/296,753

(22) Filed: Dec. 7, 2005

(65) Prior Publication Data
US 2007/0127182 A1 Jun. 7, 2007

(51) Int. Cl.
*H02H 3/02* (2006.01)
(52) U.S. Cl. ........................... 361/93.9; 361/57
(58) Field of Classification Search ............ 361/58, 361/93.1, 93.7, 93.9, 57
See application file for complete search history.

(56) References Cited

U.S. PATENT DOCUMENTS

| | | | | |
|---|---|---|---|---|
| 3,532,899 A * | 10/1970 | Wolterman et al. | ......... | 327/389 |
| 4,429,339 A * | 1/1984 | Jaeschke et al. | ............ | 361/93.7 |
| 5,359,552 A * | 10/1994 | Dhong et al. | .......... | 365/189.09 |
| 6,160,693 A * | 12/2000 | Sairanen | .................... | 361/91.5 |
| 7,102,951 B2 * | 9/2006 | Paillet et al. | ............. | 365/225.7 |

* cited by examiner

*Primary Examiner*—Michael J Sherry
*Assistant Examiner*—Nicholas Ieva
(74) *Attorney, Agent, or Firm*—Bo-In Lin

(57) ABSTRACT

A circuit and method for controlling a MOSFET based switch that includes two back-to-back FET to block current flow in the OFF state irrespective of the polarity of the voltage differential across the switch. The MOSFET based switch further has a built-in current limit function by sensing the current flow through one of the two MOSFET switches. Furthermore, the bilateral current-limited switch further includes circuitry required for controlling both P type and N type FET in either common drain or common source configuration.

29 Claims, 6 Drawing Sheets

CURRENT LIMITED BILATERAL MOSFET SWITCH WITH REDUCED SWITCH RESISTANCE AND LOWER MANUFACTURING COST

BACKGROUND OF THE INVENTION

1. Field of the Invention

The invention disclosed herein relates generally to the circuit design and configuration of power MOSFET based devices. More particularly, this invention relates to a novel and improved circuit configuration designs and manufacturing methods for providing current limited bi-lateral MOSFET switches.

2. Description of the Prior Art

Conventional technologies and circuit designs for current limited bilateral switch implemented with FET based transistors are still limited by a technical difficulty that the switching resistance is high and cannot be conveniently implemented in device where higher power efficiency is required. As will be further discussed below specifically, combinations of circuits employed to enable bilateral switch and also limiting the current often inadvertently increase the switching resistance. The increase in switch resistance inevitably leads to the undesirable effects of power wastes, loss of efficiency and heat generations. The technical difficulty thus limits the application of the FET-based bilateral switches to many applications while there are increasing demands to provide effective and conveniently integration FET based power devices and power switches.

A bilateral power switch implemented with common source P-FET transistors Q1 and Q2 is shown in FIGS. 1A and 1B. The power switch is applied for transferring power from a power source to a load connected between a ground voltage and Vout with current Iload flowing through the load. The transistor Q1 is a PMOS based switch that switches off the current flow between the terminals of Vin and Vout in an off state. The second PMOS transistor Q2 connected in parallel to the transistor Q1 between the input and output voltages serve a function to prevent a current to pass from the Vout terminal to the Vin terminal during an off state as that shown in FIG. 1B. Effectively, in an off state the two back-to-back body-to-drain diodes ensure the current cannot flow in either direction. For the purpose to ensure the bilateral OFF operations as described above, the gate voltage applied to the gate terminals of Q1 and Q2 are selected as a higher voltage between the Vin and Vout.

FIGS. 2A and 2B show an alternate bilateral switch implemented with NMOS transistors. In order to ensure the NMOS transistors have enough gate overdrive (Vgs−Vth), a charge pump is necessary to lift the gate voltage to twice that of Vin, or Vgs=Vin. A 2× charge pump is usually sufficient. However, depending on the FET, 3× or even 4× Vin may be necessary at times to provide sufficient gate overdrive.

As shown in FIGS. 1A, 1B and 2A and 2B, the two MOSFET transistors as implemented in the bilateral power switches can be connected in either a common drain or common source configuration. The same blocking effect is achieved in an OFF state in either of bilateral switches as shown. Although such bilateral switches have a reduced power carrying capability due to a Rdson that is twice that of the switches implemented with a single FET transistor, the bilateral stand-off capability makes it an acceptable trade-off.

In addition to the requirement to totally switch off the reverse current, there is also a need to limit the current passing through the load. A current limiting switch that is implemented with a P-channel power MOSFET Q1 is shown in FIG. 3A. When the load starts to draw excessive current, the current limiting switch stabilizes the load current to a pre-set value irrespective of the load resistance and holds the current at that preset value indefinitely, or until other protection circuitry, such as a thermal shutdown, is activated. The primary control circuitry consists of a sense resistor, Rs, and an amplifier, A1. When the load current is low and voltage drop across the sense resistor is lower than Vlim, the output voltage (Vdrv) of A1 is driven to ground rail and the Q1 switch is fully turned on. When Vs is increased to Vlim, the amplifier A1 drives the gate of Q1, or Vdrv, higher which results in reduced gate drive to Q1 and forcing the device into saturation region of operation. Continued pulling down action by the load will eventually drive Vout to near ground but the load current will stay at the value set by Vlim/Rs. Once the load is removed, Vs reduces to zero and A1 will return the gate of Q1 to ground and back to fully ON state.

FIG. 3B shows an alternate current limiting switch implemented with an N-channel Power transistor. Since the required charge pump for the NMOS gate drive often has high output impedance, when integrated into an IC, it is usually not possible to power the amplifier A1 directly from the charge pump. A method frequently used is to reduce the charge pump output (Vdrv) by pulling down the output with an Ipd driver shown in FIG. 3B, otherwise, the current regulation function is carried out exactly the same as that performed by the PMOS switch as that shown and described in FIG. 3A.

Conventional bilateral current limited switches are configured by a combination of the bilateral switches as that shown in FIGS. 1A, 1B, 2A and 2B with the current limiting sensing resistor implemented in the current limited switch shown in FIGS. 3A and 3B. FIG. 4A shows such a current limited bilateral PMOS power switch and FIG. 4B shows a similar switch configured based on an NMOS power transistor. The operations of the bilateral switch and the current limiting function performed by these bilateral current limited switches shown in FIGS. 4A and 4B are self-evident from the above descriptions.

Even though the bilateral current limited switches as shown in FIGS. 4A and 4B are functional to totally switch off the current during an off state and is able to limit a load current to a preset value. However, such switches present a severe technical difficulty due to a high switch resistance when a switch is configured with such combination of circuits. Specifically, the switch resistance is now increased to a value 2×Rdson+Rs. For high power applications, such bilateral switches often present high power consumption and low operational efficiency and would not be acceptable.

Therefore, a need still exists in the art to provide an improved device configuration and manufacturing methods to provide FET based bilateral current limited switches with reduced switch resistance such that the above-discussed technical difficulties can be resolved.

SUMMARY OF THE PRESENT INVENTION

It is therefore an aspect of the present invention to provide an improved current limited bilateral switch with reduced resistance such that the above-discussed technical difficulties are resolved. The resistance is reduced by implementing one of two back-to-back common drain or common source FET transistors as a linear resistor to eliminate the requirement of a sensed resistor. A current limiting circuit that measures and limits the voltage across one of the two back-to-back FET transistors that functions as the linear resistor is implemented to limit the current conducted through the bilateral switch.

Specifically, it is one aspect of the present invention to provide an improved circuit and method for controlling a MOSFET based switch with (1) two back-to-back FET to block current flow in the OFF state irrespective of the polarity of the voltage differential across the switch, (2) built-in current limit function by sensing the current flow through one of the two MOSFET switches and (3) circuitry needed for controlling both P type and N type FET in either common drain or common source configuration.

Briefly in a preferred embodiment this invention discloses a current limited bilateral switch that includes two back-to-back field effect transistors (FETs) for switching off a current flow in an OFF state irrespective of a voltage polarity applied to the bilateral switch wherein one of the two back-to-back FET transistor further functioning as a sensed linear resistor. The bilateral switch further includes a current limit circuit for sensing and limiting a voltage across the one of the back-to-back FET transistors functioning as the sensed linear resistor. In a preferred embodiment, the two back-to-back FETs further having a drain-to-source resistance of Rdson and the current limited bilateral switch having a total resistance substantially equal to two times the resistance Rdson. In another preferred embodiment, the two back-to-back FETs further include two back-to-back common source P-FET transistors. In another preferred embodiment, the two back-to-back FETs further include two back-to-back common drain P-FET transistors. In another preferred embodiment, the two back-to-back FETs further include two back-to-back common source N-FET transistors. In another preferred embodiment, the two back-to-back FETs further include two back-to-back common drain N-FET transistors. In another preferred embodiment, the current limiting circuit further includes a current-limiting voltage generator having a limiting voltage Vlim for comparing with and limiting the voltage across the one of two back-to-back transistors functioning as the sensed linear resistor. In another preferred embodiment, the current-limiting voltage generator further includes a band-gap reference generator for providing the limiting voltage Vlim for comparing with and limiting the voltage across the one of two back-to-back transistors functioning as the sensed linear resistor. In another preferred embodiment, the current limiting circuit further includes a comparator for comparing the current-limiting voltage Vlim with the voltage across the one of two back-to-back transistors functioning as the sensed linear resistor.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
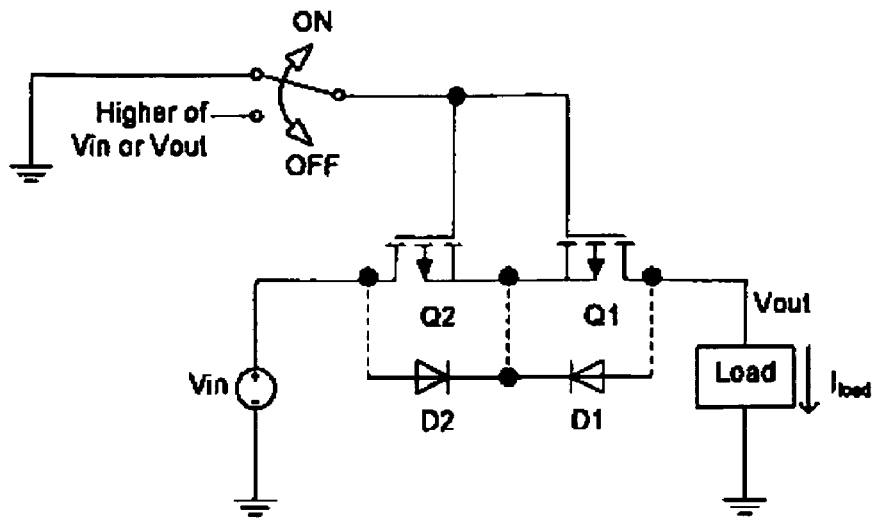
FIGS. 1A and 1B are circuit diagrams for illustrating conventional bilateral power switch implemented with common source P-FET transistors shown in the ON and OFF states respectively.
Figure 1B:
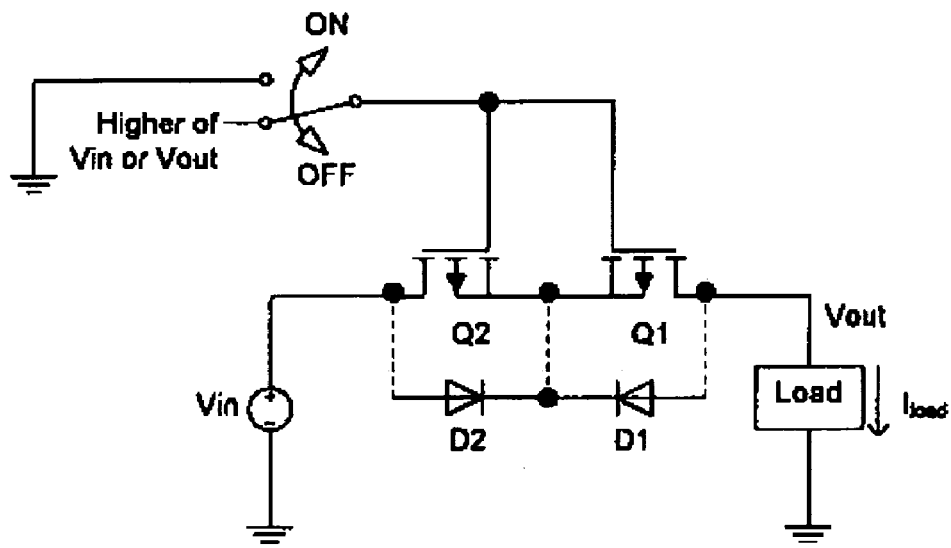
Figure 2A:
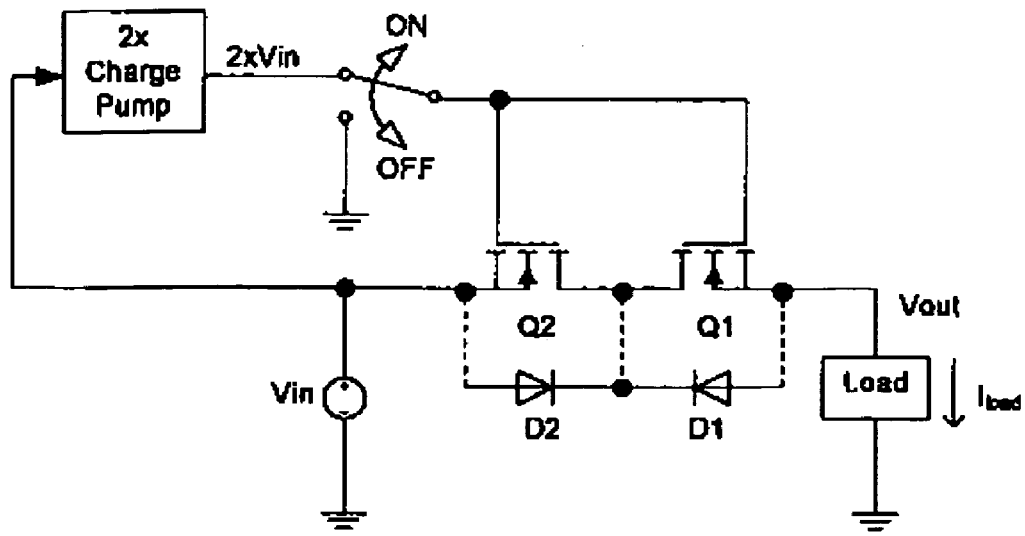
FIGS. 2A and 2B are circuit diagrams for illustrating conventional bilateral power switch implemented with common drain N-FET transistors shown in the ON and OFF states respectively.
Figure 2B:
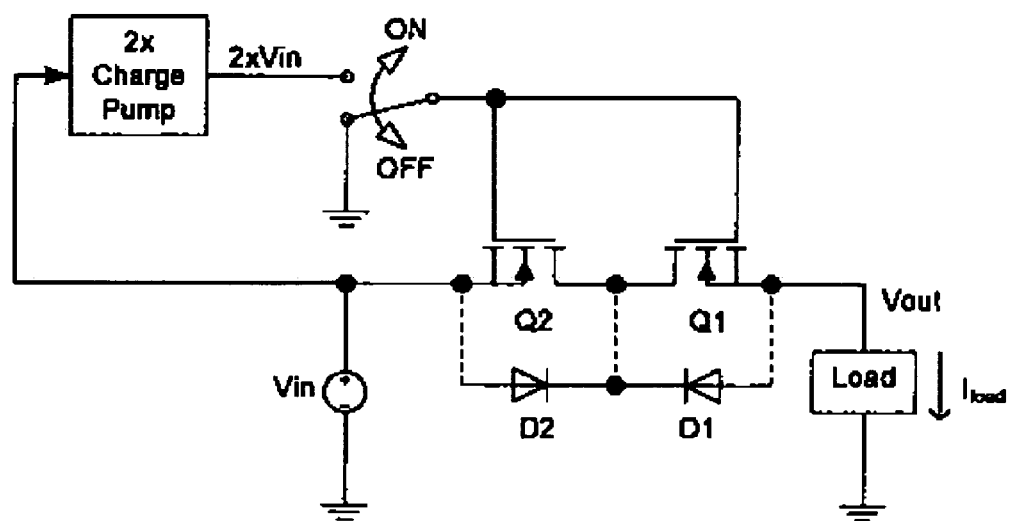
Figure 3A:
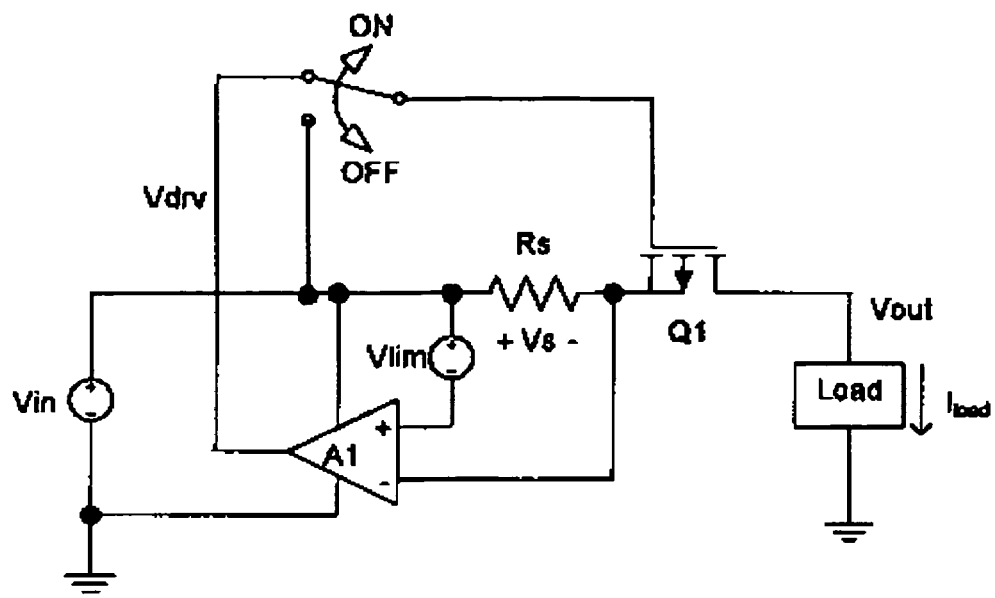
FIGS. 3A and 3B are circuit diagrams for illustrating conventional current limit circuits implemented with a P-channel and N-channel power switch respectively.
Figure 3B:
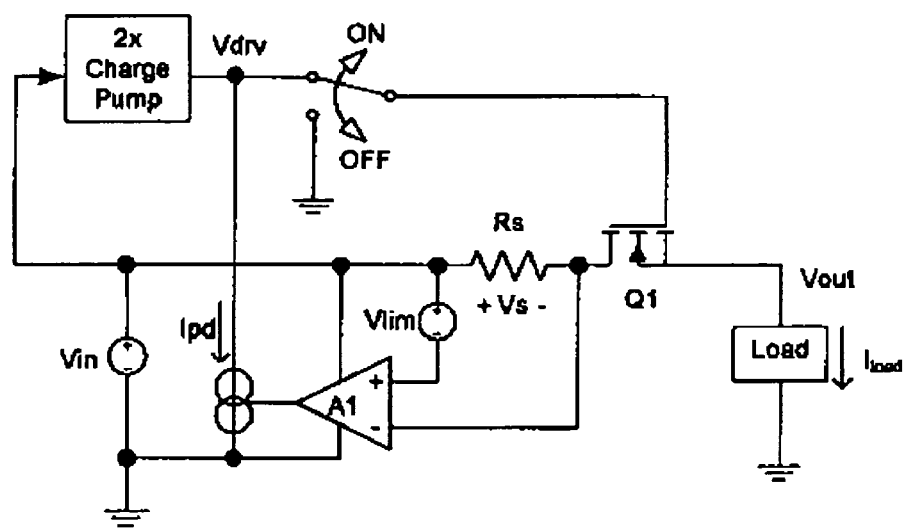
Figure 4A:
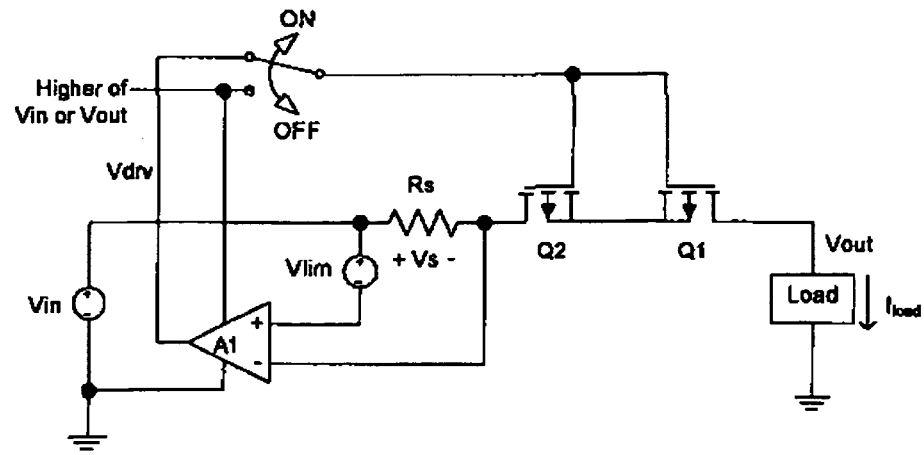
FIGS. 4A and 4B are circuit diagrams for illustrating conventional current limited bilateral switch implemented with a P-channel and N-channel power switch respectively.
Figure 5A:
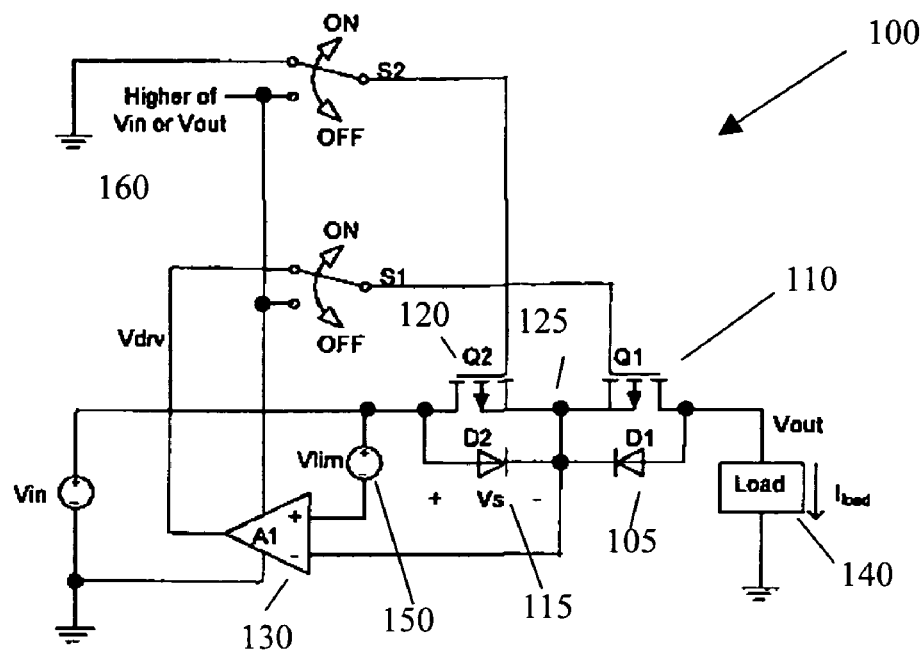
FIGS. 5A and 5B are circuit diagrams for illustrating improved current limited bilateral switches implemented with a common-source and common-drain P-FET transistors respectively.

Referring to FIG. 5A for a circuit diagram for a new and improved current limited bilateral switch implemented with two common-source P-FET transistors to overcome the above-discussed technical difficulties. The current limited bilateral power switch 100 includes two common-source P-FET transistors 110 and 120 shown as Q1 and Q2 respectively with a common source node 125. The second P-FET bilaterally functional transistor 120 serves the functions of a sense resistor, e.g., Rs shown in FIGS. 4A. The voltage drop across the P-FET transistor 120 is sensed by an amplifier 130 shown as A1. The voltage drop across the P-FET transistor 120 is represented by a value of Iload×Rdson2 where Iload is the current passes through the load 140 and the Rdson2 is the resistance between the source and drain of the second P-FET transistor 120. The voltage drop across the P-FET transistor 120 is compared against a current-limiting voltage Vlim 150 that is implemented to prevent the current to exceed a limit of Vlim/Rdson2. The current-limiting voltage Vlim 150 is derived from a reference voltage generator (not specifically shown). A well-known example of the voltage generator among the circuit designers may be a band-gap reference voltage generator.

Figure 4B:
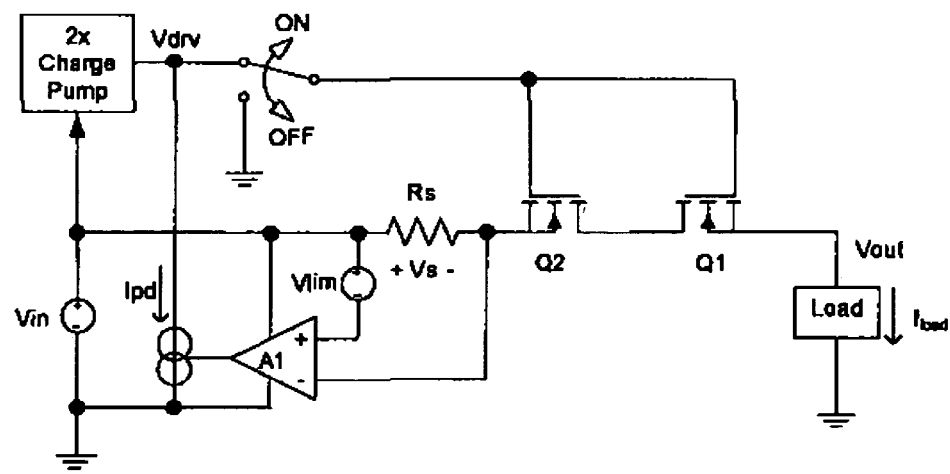

The gate of the second P-FET transistor 120 is now connected to and driven separately by another switchable voltage source 160. The switchable voltage source 160 is connected to either a ground voltage at an ON-state or to a voltage source having a voltage of either Vin or Vout whichever is higher at an Off-state. The gate terminal of the second P-FET transistor 120 is effectively driven constantly at an heavily "ON" state by applying fully supply voltage across the gate-source terminals to assure the device provides a function as a linear resistor continuously. For example, if supply is 5 volts, it means Vgs=−5V for a PFET and Vgs=+5V for a NFET. The linear resistor behavior as provided by the transistor 120 does have a limit. Specifically, in the event the voltage drop across transistor 120 approaches 0.5V, the body diode 115, also shown as D2, is likely to turn on, especially at higher temperature. This will introduce non-linearity to the sensor resistance. However, for most power applications, the voltage drop is likely to stay safely below 0.5V. In comparison to the conventional bilateral current limited switch, the new and improved current limited bilateral power switch 100 as shown in FIG. 5A that applies the second P-FET transistor 120 as the sense resistor has a reduced total resistance by eliminating the requirement of employing a separate sense resistor Rs as shown in FIGS. 4A and 4B.

Figure 5B:
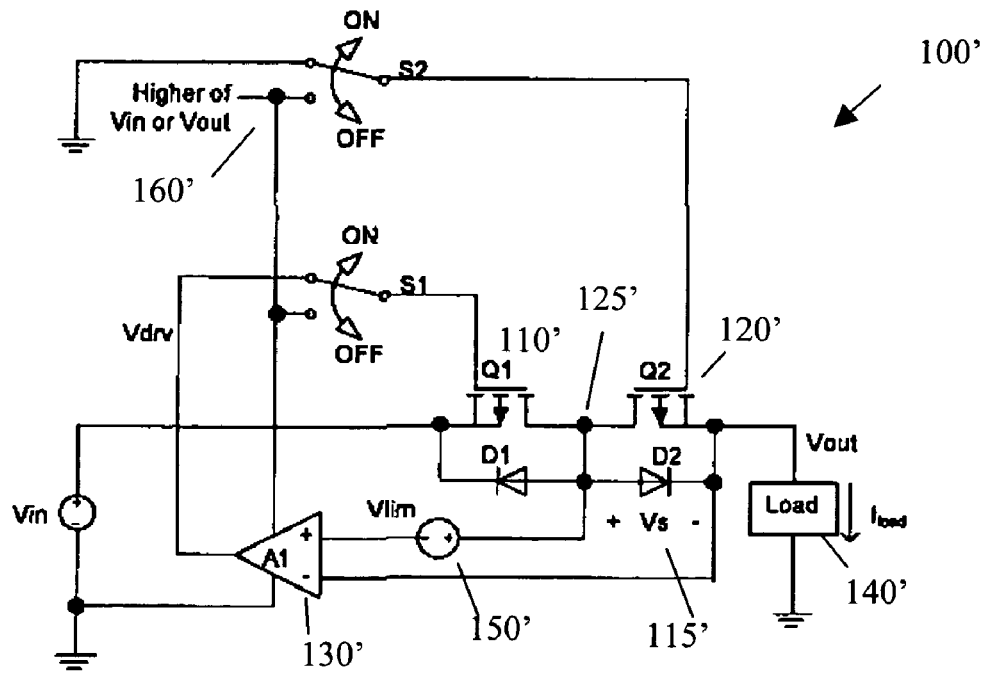

FIG. 5B is an alternate embodiment of a current limited bilateral switch 100' implemented with a common-drain P-FET transistors. This common drain configuration is a more popular technology commonly employed among the MOSFET manufacturers. The current limited bilateral power switch 100' includes two common-drain P-FET transistors 110' and 120' shown as Q1 and Q2 respectively with a common drain node 125'. The second P-FET bilaterally functional transistor 120' serves the functions of a sense resistor, e.g., Rs shown in FIG. 4A. The voltage drop across the P-FET transistor 120' is sensed by an amplifier 130' shown as A1. The voltage drop across the P-FET transistor 120' is represented by a value of Iload×Rdson2 where Iload is the current passes through the load 140' and the Rdson2 is the resistance between the source and drain of the second P-FET transistor 120'. The drop of voltage across the P-FET transistor 120' is compared against a current-limiting voltage Vlim 150' that is implemented to prevent the current to exceed a limit of Vlim/Rdson2.

The gate of the second P-FET transistor 120' is now connected to and driven separately by another switchable voltage source 160'. The switchable voltage source 160' is connected to either a ground voltage at an ON-state or to a voltage source having a voltage of either Vin or Vout whichever is higher at an Off-state. The gate terminal of the second P-FET transistor 120' is effectively driven constantly at a heavily "ON" state to assure the device provides a function as a linear resistor continuously. Comparing to FIG. 5A, the circuit implementation of this embodiment is more demanding. Specifically, in a common source implementation as shown in FIG. 5A, the amplifier 130 is implemented with a common mode input range at or near the Vin supply rail, while in a common drain embodiment, the amplifier 130' must have a wide varying input common mode during a short circuit condition. In normal operation, the switch voltage is near the input supply. In short circuit or when the load resistor, i.e., Rload, is close ~0 ohm, the switch voltage will be forced near ground. For other short load resistance, the switch could be in the middle of the supply. Therefore, the amplifier for the common drain embodiment must have a rail-to-rail common mode input capability. On the other hand, for the common source, the sense FET is always at input supply level and the current sense amplifier only needs a common mode input at the positive rail.

Figure 6A:
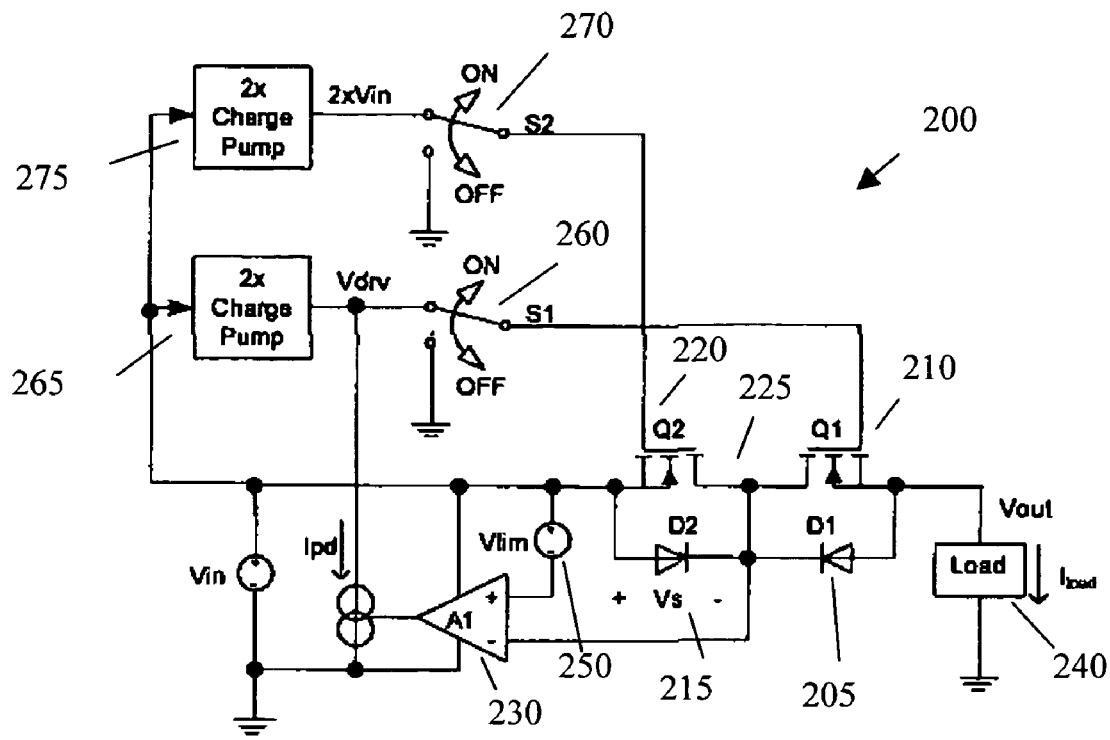
FIGS. 6A and 6B are circuit diagrams for illustrating improved current limited bilateral switches implemented with a common drain and common-source N-FET transistors respectively.

FIG. 6A shows a circuit diagram of another embodiment of this invention of a current limited bilateral switch implemented with common drain N-FET transistors. The current limited bilateral power switch 200 includes two common-source N-FET transistors 210 and 220 shown as Q1 and Q2 respectively with a common drain node 225. The second N-FET bilaterally functional transistor 220 serves the functions of a sense resistor, e.g., Rs shown in FIG. 4B. The voltage drop across the N-FET transistor 220 is sensed by an amplifier 230 shown as A1. The voltage drop across the N-FET transistor 220 is represented by a value of Iload×Rdson2 where Iload is the current passes through the load 240 and the Rdson2 is the resistance between the source and drain of the second N-FET transistor 220. The voltage drop across the N-FET transistor 220 is compared against a current-limiting voltage Vlim 250 that is implemented to prevent the current to exceed a limit of Vlim/Rdson2. The gate of the first N-FET transistor 210 is connected via a first switch 260 to a first charge pump 265 and the second N-FET transistor 220 is connected via a second switch 270 to a second charge pump 275. The first and second switches 260 and 270 are switching between a ground voltage at an OFF-state of to a 2×charg-pump voltage at an ON-state. The second charge pump 275 is applied to power the second N-FET transistor 220 to a resistive region with a voltage of approximately 2×Vin and the first charge pump 265 is applied to control the gate voltage Vdvr of the first N-FET transistor 210 serving the function as a pass FET. The current Ipd applies to the NFET and the current Ipd is a pull-down current source controlled by the switch current sense amplifier. In the event of excessive current, it will increase in value and gradually pulls down the charge pump output. In doing so, it reduces the gate drive available to the NFET and reduces its drain current until equilibrium is reached, or Iout=Vlim/Rdson2. For PFET switch, the current sense amplifier operates exactly the same, except it is implemented as a voltage amplifier with an output swing from ground to Vin.

Figure 6B:
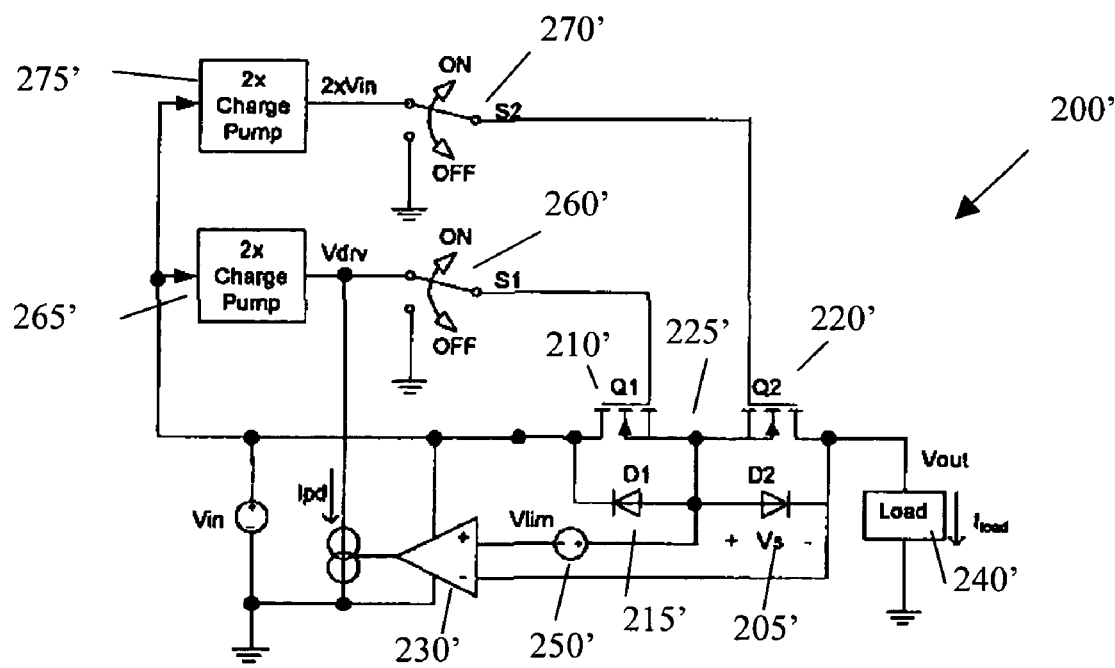

Referring to FIG. 6B for a circuit diagram of an alternate embodiment of a current limited bilateral switch implemented with common source N-FET transistors. The current limited bilateral power switch 200' includes two common-source N-FET transistors 210' and 220' shown as Q1 and Q2 respectively with a common source node 225'. The second N-FET bilaterally functional transistor 220' serves the functions of a sense resistor, e.g., Rs shown in FIG. 4B. The voltage drop across the N-FET transistor 220' is sensed by an amplifier 230' shown as A1. The voltage drop across the N-FET transistor 220' is represented by a value of Iload×Rdson2 where Iload is the current passes through the load 240' and the Rdson2 is the resistance between the source and drain of the second N-FET transistor 220'. The voltage drop across the N-FET transistor 220' is compared against a current-limiting voltage Vlim 250' that is implemented to prevent the current to exceed a limit of Vlim/Rdson2. The gate of the first N-FET transistor 210' is connected via a first switch 260' to a first charge pump 265' and the second N-FET transistor 220' is connected via a second switch 270' to a second charge pump 275'. The first and second switches 260' and 270' are switching between a ground voltage at an OFF-state of to a 2×charg-pump voltage at an ON-state. The second charge pump 275' is applied to power the second N-FET transistor 220' to a resistive region with a voltage of approximately 2×Vin and the first charge pump 265 is applied to control the gate voltage Vdvr of the first N-FET transistor 210 serving the function as a pass FET. Alternatively, one low impedance charge pump can be used instead of using two separate charge pumps as shown. Comparing with the more popular implementation of a common drain configuration shown in FIG. 6A, the common source configuration as shown in FIG. 6B is more difficult to design. Specifically, the amplifier 230 in the common drain bilateral switch does not require rail-to-rail capability while the rail-to-rail input range is required for the amplifier 230' for the common source configuration.

According to above descriptions, the current limited bilateral switches as shown in FIGS. 5A, 5B and 6A and 6B, the total switch resistance is reduced to a common bilateral switch resistance of 2×Rdson. An expensive sense resistor is eliminated while the switch still retains an inherent current limit capability. The actual current limit is set by Vlim/Rdson. With a matured trimming technique for mass production, the current limit could be set with a high degree of accuracy. From the total cost point of view, the NMOS approach is far more cost effective than the PMOS. With electron mobility at twice that of the hole, the NMOS is twice as efficient as PMOS. Although another charge pump may be needed in the proposed technique, the extra cost is minimal for most DC load switch in an integrated circuit. The high impedance 2× charge pump can be implemented in a relatively small silicon real estate.

According to above descriptions and drawings, this invention further includes a current limited switch that includes a first and a second filed effect transistors (FET) wherein the first FET functioning as a switch and the second FET functioning as sensed resistor. In a preferred embodiment, the first and the second filed effect transistors (FET) are connected with a back-to-back configuration. In another preferred embodiment, the first and the second filed effect transistors (FET) functioning as a bilateral switch.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A current limited bilateral DC load switch comprising:
   two back-to-back field effect transistors (FETs) for switching off a current flow in an OFF state irrespective of a voltage polarity applied to said bilateral switch and each of said two back-to-back FET transistors is driven by a separate signal wherein one of said two back-to-back FET transistors further functioning as a sensed linear resistor; and
   a current limit circuit for sensing and limiting a voltage drop across said one of said back-to-back FET transistors functioning as said sensed linear resistor.

2. The current limited bilateral DC load switch of claim 1 wherein:
   each of said two back-to-back FETs further having a drain-to-source resistance of Rdson and said current limited bilateral switch having a total resistance substantially equal to two times the resistance Rdson.

3. The current limited bilateral DC load switch of claim 1 wherein:
   said two back-to-back FETs further comprising two back-to-back common source P-FET transistors.

4. The current limited bilateral DC load switch of claim 1 wherein:
   said two back-to-back FETs further comprising two back-to-back common drain P-FET transistors.

5. The current limited bilateral DC load switch of claim 1 wherein:
   said two back-to-back FETs further comprising two back-to-back common source N-FET transistors.

6. The current limited bilateral DC load switch of claim 1 wherein:
   said two back-to-back FETs further comprising two back-to-back common drain N-FET transistors.

7. The current limited bilateral DC load switch of claim 1 wherein:
   said current limiting circuit further includes a current-limiting voltage generator having a limiting voltage Vlim for comparing with and limiting said voltage drop not greater than said limiting voltage Vlim across said one of two back-to-back transistors functioning as said sensed linear resistor.

8. The current limited bilateral DC load switch of claim 7 wherein:
   said current-limiting voltage generator further comprising a band-gap reference generator for providing said limiting voltage Vlim for comparing with and limiting said voltage drop not greater than said limiting voltage Vlim across said one of two back-to-back transistors functioning as said sensed linear resistor.

9. The current limited bilateral DC load switch of claim 7 wherein:
   said current limiting circuit further includes a comparator for comparing said current-limiting voltage Vlim with said voltage drop across said one of two back-to-back transistors functioning as said sensed linear resistor.

10. The current limited bilateral DC load switch of claim 1 further comprising:
    a switchable voltage source for switching said current limited bilateral switch to an ON or OFF state.

11. The current limited bilateral DC load switch of claim 1 wherein:
    said current limit circuit further comprising an amplifier for sensing a voltage drop across said one of said back-to-back FET transistors functioning as said sensed linear resistor.

12. The current limited bilateral DC load switch of claim 11 wherein:
    said current limiting circuit further includes a current-limiting voltage generator having a limiting voltage Vlim for inputting to said amplifier for comparing with and limiting said voltage drop not greater than said limiting voltage Vlim across said one of two back-to-back transistors functioning as said sensed linear resistor.

13. The current limited bilateral DC load switch of claim 1 wherein:
    said two back-to-back FETs further comprising two back-to-back P-FET transistors;
    said current limited bilateral switch further comprising a switchable voltage source for switching said current limited bilateral switch to an ON or OFF state; and
    said switchable voltage source further applying a full supply voltage to a gate terminal of said one of two back-to-back transistors to continuously function as said sensed linear resistor.

14. The current limited bilateral DC load switch of claim 1 wherein:
    said two back-to-back FETs further comprising two back-to-back N-FET transistors;
    said current limited bilateral switch further comprising a first charge pump to apply a voltage to said one of said two back-to-back transistors to function as said sensed linear resistor; and
    said current limited bilateral switch further comprising a second charge pump to control a gate voltage of another of said back-to-back N-FET transistors to function as a pass FET.

15. A current limited DC load switch comprising:
    a first and a second filed effect transistors (FETs) each driven by a separate signal wherein said first FET functioning as a switch and said second FET functioning as sensed linear resistor for limiting a current passing therethrough by limiting a voltage drop across said second FET.

16. The current limited DC load switch of claim 15 wherein:
    said first and said second filed effect transistors (FET) are connected with a back-to-back having a common-source or common-drain configuration.

17. The current limited DC load switch of claim 15 wherein:
    said first and said second filed effect transistors (FET) functioning as a current-limited bilateral switch.

18. A method for bilaterally switching off a current flow in an OFF state and for conducting a limited current during a switch ON state comprising:
    implementing and driving each of two back-to-back field effect transistors (FETs) with two separate driving signals for switching off a current flow in an OFF state irrespective of a voltage polarity applied to said bilateral switch and applying one of said two back-to-back FET transistors to function as a sensed linear resistor; and
    sensing and limiting a voltage drop not greater than a limiting voltage Vlim across said one of said back-to-back FET transistors functioning as said sensed linear resistor for conducting said limited current during said switch ON state.

19. The method of claim 18 wherein:
said step of implementing and driving said two back-to-back FETs further comprising a step of implementing each of said two back-to-back FETs having a drain-to-source resistance of Rdson and configuring said current limited bilateral switch to have a total resistance substantially equal to two times the resistance Rdson.

20. The method of claim 18 wherein:
said step of implementing and driving said two back-to-back FETs further comprising a step of implementing and driving each of said two back-to-back FETs with two back-to-back common source P-FET transistors.

21. The method of claim 18 wherein:
said step of implementing and driving said two back-to-back FETs further comprising a step of implementing and driving each of said two back-to-back FETs with two back-to-back common drain P-FET transistors.

22. The method of claim 18 wherein:
said step of implementing and driving said two back-to-back FETs further comprising a step of implementing and driving each of said two back-to-back FETs with two back-to-back common source N-FET transistors.

23. The method of claim 18 wherein:
said step of implementing and driving said two back-to-back FETs further comprising a step of implementing and driving each of said two back-to-back FETs with two back-to-back common drain N-FET transistors.

24. The method of claim 18 wherein:
said step of sensing and limiting a voltage drop not greater than a limiting voltage Vlim across said one of said back-to-back FET transistors functioning as said sensed linear resistor further comprising a step of applying a current-limiting voltage generator having said limiting voltage Vlim for comparing with and limiting said voltage drop not greater than a limiting voltage Vlim across said one of two back-to-back transistors functioning as said sensed linear resistor.

25. The method of claim 24 wherein:
said step of applying said current-limiting voltage generator further comprising a step of applying a band-gap reference generator for providing said limiting voltage Vlim for comparing with and limiting said voltage drop not greater than a limiting voltage Vlim across said one of two back-to-back transistors functioning as said sensed linear resistor.

26. The method of claim 24 further comprising a step of:
applying a comparator for comparing said current-limiting voltage Vlim with said voltage drop not greater than a limiting voltage Vlim across said one of two back-to-back transistors functioning as said sensed linear resistor.

27. The method of claim 18 further comprising:
applying a switchable voltage source for switching said current limited bilateral switch to an ON or OFF state.

28. The method of claim 18 wherein:
said step of sensing and limiting a voltage drop across said one of said back-to-back FET transistors functioning as said sensed linear resistor further comprising a step of implementing an amplifier for sensing said voltage drop across said one of said back-to-back FET transistors functioning as said sensed linear resistor.

29. The method of claim 28 wherein:
said step of sensing and limiting a voltage across said one of said back-to-back FET transistors functioning as said sensed linear resistor further comprising a step of implementing a current-limiting voltage generator having said limiting voltage Vlim for inputting to said amplifier for comparing with and limiting said voltage drop not greater than said limiting voltage Vlim across said one of two back-to-back transistors functioning as said sensed linear resistor.

* * * * *